United States Patent
Badcock et al.

(10) Patent No.: US 12,439,833 B2
(45) Date of Patent: Oct. 7, 2025

(54) SUPERCONDUCTING SWITCH

(71) Applicant: VICTORIA LINK LIMITED, Wellington (NZ)

(72) Inventors: Rodney Alan Badcock, Wellington (NZ); Christopher William Bumby, Wellington (NZ); Jianzhao Geng, Wellington (NZ)

(73) Assignee: VICTORIA LINK LIMITED, Wellington (NZ)

(*) Notice: Subject to any disclaimer, the term of this patent is extended or adjusted under 35 U.S.C. 154(b) by 745 days.

(21) Appl. No.: 17/771,087

(22) PCT Filed: Oct. 23, 2020

(86) PCT No.: PCT/NZ2020/050132
§ 371 (c)(1),
(2) Date: Apr. 22, 2022

(87) PCT Pub. No.: WO2021/080443
PCT Pub. Date: Apr. 29, 2021

(65) Prior Publication Data
US 2022/0416649 A1    Dec. 29, 2022

(30) Foreign Application Priority Data
Oct. 25, 2019  (AU) ................ 2019904009

(51) Int. Cl.
*H10N 60/355*  (2023.01)
*H01F 6/02*  (2006.01)
(Continued)

(52) U.S. Cl.
CPC ............. *H10N 60/355* (2023.02); *H01F 6/02* (2013.01); *H01F 6/06* (2013.01); *H02H 9/023* (2013.01); *H01F 2006/001* (2013.01)

(58) Field of Classification Search
CPC .......... H10N 60/355; H01F 6/02; H01F 6/06; H01F 2006/001; H02H 9/023
See application file for complete search history.

(56) References Cited

U.S. PATENT DOCUMENTS

| | | | |
|---|---|---|---|
| 2,983,889 A | 5/1961 | Green et al. | |
| 3,200,299 A | 8/1965 | Autler | |

(Continued)

FOREIGN PATENT DOCUMENTS

| | | |
|---|---|---|
| CN | 103956719 | 7/2014 |
| CN | 108470617 | 8/2018 |

(Continued)

OTHER PUBLICATIONS

J. Geng et al., "HTS Persistent Current Switch Controlled by AC Magnetic Field," in IEEE Transactions on Applied Superconductivity, vol. 26, No. 3, pp. 1-4, Apr. 2016, Art No. 6603304, doi: 10.1109/TASC.2016.2540166.

(Continued)

*Primary Examiner* — Paul A Wartalowicz
(74) *Attorney, Agent, or Firm* — Leason Ellis LLP

(57) ABSTRACT

The invention relates to a superconducting electrical switch. The switch comprises two parallel branches of superconducting material in a loop, and a magnetic field generator which generates a time-varying magnetic field through the loop in a direction generally parallel to the axis of the loop. The magnetic field generator is selectively activated and de-activated to switch the electrical switch between a low-resistance state and a higher-resistance state. In the low-resistance state, there is no magnetic field through the loop and transport current flows through the loop. In the higher-resistance state, a magnetic field through the loop induces a screening current such that the sum of the transport current and the screening current is substantially equal to the critical current or is greater than the critical current of the super- (Continued)

conducting material. The switch may be used in, for example, a rectifier or fault current limiter.

20 Claims, 13 Drawing Sheets

(51) Int. Cl.
*H01F 6/06* (2006.01)
*H02H 9/02* (2006.01)
*H01F 6/00* (2006.01)

(56) References Cited

U.S. PATENT DOCUMENTS

| | | | |
|---|---|---|---|
| 5,241,447 | A | 8/1993 | Barber et al. |
| 5,376,626 | A | 12/1994 | Drehman et al. |
| 5,892,644 | A | 4/1999 | Evans et al. |
| 10,269,478 | B2 | 4/2019 | Geng et al. |
| 10,454,014 | B2 | 10/2019 | Najafi et al. |
| 10,861,734 | B2 | 12/2020 | Najafi et al. |
| 2007/0127171 | A1 | 6/2007 | Lee et al. |
| 2009/0103217 | A1* | 4/2009 | Langtry ............ G01R 33/3815 361/19 |
| 2009/0314617 | A1* | 12/2009 | Lee .................. H10N 60/355 200/237 |
| 2010/0073115 | A1 | 3/2010 | Gilgrass et al. |
| 2013/0096008 | A1 | 4/2013 | Bright et al. |
| 2016/0197471 | A1 | 7/2016 | Klaus et al. |
| 2017/0040095 | A1 | 2/2017 | Levin et al. |
| 2019/0140157 | A1 | 5/2019 | Najafi et al. |
| 2019/0341179 | A1* | 11/2019 | Miller, Jr. ............ H01B 12/00 |

FOREIGN PATENT DOCUMENTS

| | | |
|---|---|---|
| WO | 20170021674 A1 | 2/2017 |
| WO | 2022/207413 A1 | 10/2022 |

OTHER PUBLICATIONS

C. R. Vail, M. S. P. Lucas, H. A. Owen, and W. C. Stewart, an Approach to the Experimental Study of Persistent-Current Devices, Solid-State Electronics, 1960, vol. 1, pp. 279-286.
Notice of Reasons for Rejection in JP Application No. 2022-524169, mailed Nov. 25, 2024, an English translation is attached hereto (6 pages).
Extended European Search Report in EP Application No. 20879073.3-1211/4035214, mailed Sep. 14, 2023 (6 pages).
International Search Report and Written Opinion in PCT Application No. PCT/NZ2020/050132, mailed Jan. 14, 2021.
Li, C. et al., "Design for a Persistent Current Switch Controlled by Alternating Current Magnetic Field", IEEE Transactions on Applied Superconductivity, vol. 28, No. 4, Jun. 2018, p. 1-5.
Burlakov, A. A. et al., "Superconducting quantum interference device without Josephson junctions", JETP Letters 99(3): 169 • Jan. 2014, p. 1-4.
Solovyov, V. F. et al., "Fast high-temperature superconductor switch for high current applications", Applied Physics Letters 103, 032603 (2013), p. 1-3.
Fink, H. J. et al., "Quantum-interference device without Josephson junctions", Physical Review B vol. 35, No. 1, Jan. 1, 1987, p. 35-37.

* cited by examiner

SUPERCONDUCTING SWITCH

CROSS REFERENCE TO RELATED APPLICATIONS

This patent application is a U.S. National Phase Application under 35 U.S.C. § 371 of International Patent Application No. PCT/NZ2020/050132, filed on Oct. 23, 2020, which claims priority from Australian Patent Application No. 2019904009, filed on Oct. 25, 2019, all of which are incorporated by reference, as if expressly set forth in their respective entireties herein.

FIELD OF INVENTION

The present technology relates to electrical switches. The present technology may find particular application as a superconducting switch; however, this should not be seen as limiting on the invention.

BACKGROUND TO THE INVENTION

In superconducting circuits it is often difficult to introduce components which have similarly low, or zero resistance conductive paths. Introducing components which are not superconducting can result in a degradation of the circuit performance, making the overall circuit less efficient. Furthermore, when resistance is added to a high-current superconducting circuit, greater cooling is needed to counteract the heating of the resistive component.

A further issue with introducing resistive components into a superconducting circuit is that any DC currents flowing in said circuit will immediately decay if the current supply is removed. In contrast, in superconducting circuits, the current decays in accordance with the time constant (L/R) of the circuit. In other words, circuits which are superconducting have the advantage of being able to support the flow of DC currents long after the supply has been turned off. The current decay rate in these superconducting circuits is determined by any non-zero resistance associated with normal-conducting joints within the circuit.

There is accordingly a need to be able to provide components or arrangements which are able to work efficiently in a superconducting circuit without significantly degrading their performance.

One type of component used in these superconducting circuits are variable-resistance current switches. However, there are a number of known disadvantages of existing current switch devices. For example, thermally controlled switches are typically slow to respond and are unsuitable for use in high-speed switching applications. Current-controlled switches normally apply current pulses which exceed the critical current of the superconductor and as such these types of switch device are prone to degradation. Existing magnetic field-controlled switch devices are controlled by high strength magnetic fields, however when active, the resistance per unit length of these magnetic field-controlled switch devices is small, and the switching rates are generally limited by the large inductance of the applied field coil.

OBJECT OF THE INVENTION

It is an object of the technology to provide an electrical switch. Alternatively it is an object of the technology to provide an electrical switch which can be controllably switched between a higher resistance state and a lower resistance state.

Alternatively, it is an object of the technology to provide a superconducting electrical switch.

Alternatively, it is an object to provide a superconducting electrical switch that is smaller, more efficient, lower cost, faster switching and/or having higher switching resistance than at least some existing superconducting electrical switches.

Alternatively, it is an object of the technology to provide a rectifier comprising a superconducting electrical switch.

Alternatively, it is an object of the technology to provide a fault current limiter using a superconducting electrical switch.

Alternatively, it is an object of the technology to at least provide the public with a useful choice.

SUMMARY OF THE INVENTION

According to a first aspect of the technology there is provided an electrical switch.

According to a second aspect of the technology, there is provided an electrical switch configured to switch the resistance experienced by a current flowing between its terminals from a low-resistance state to a higher-resistance state.

According to a further aspect of the technology, there is provided an electrical switch which comprises:
a loop of superconducting material, wherein the loop comprises a first branch and a second branch, the first and second branches being electrically connected in parallel between a first terminal and a second terminal, and wherein the loop has an axis which is substantially normal to the plane of the loop; and
a magnetic field generator configured to generate a time-varying magnetic field through the loop with the direction of the magnetic field through the loop being generally parallel to, or having a component which is generally parallel to, the axis of the loop,
wherein the loop is configured to carry a transport current between the first terminal and the second terminal,
wherein the magnetic field generator is configured to be selectively activated and de-activated to switch the electrical switch between a low-resistance state and a higher-resistance state,
wherein, in the low-resistance state, the magnetic field generator does not generate the varying magnetic field through the loop and the transport current flows through the loop between the two terminals, and, in the higher-resistance state, the magnetic field generator generates the varying magnetic field through the loop, inducing a screening current in the loop, such that the sum of the transport current and the screening current in one or more of the branches approaches the critical current or is otherwise greater than or substantially equal to the critical current of the superconducting material.

Preferably, the superconducting material is a high-temperature superconductor. Use of a high-temperature superconductor may advantageously allow the present technology to be utilised at higher temperatures, which may reduce the cost of the electrical switch and increase the range of viable operating temperatures. For example, the superconducting material may comprise a rare-earth barium copper oxide (ReBCO), or any other suitable high-temperature superconductor. For example, the rare earth component may comprise yttrium (Y), gadolinium (Gd), samarium (Sm), neodymium (Nd) or any other suitable element. In alternative embodiments of the technology, the superconducting material may be magnesium diboride ($MgB_2$) or bismuth strontium calcium copper oxide (BSCCO) or a traditional low-temperature superconductor, such as niobium-titanium alloy (NbTi).

Preferably, the superconducting material is comprised as part of a tape, for example the tape may comprise a thin film of superconductor deposited upon a metal substrate and/or ceramic layers. In some cases, this thin film is then coated with a further outer protective layer of metal as should be known to those skilled in the art. However, this should not be seen as limiting on the technology. For example, the superconducting material may comprise one or more filaments embedded within a metal matrix, or wires of superconducting material.

In preferred embodiments, the electrical switch may include one or more joints between superconducting elements in the switch, such as the joining of the branches of superconducting material at each terminal. Additionally, joints may be provided between the branches of superconducting material. These joints may be constructed of a non-superconducting material or otherwise have a non-zero resistance; for example, the joint may be formed by a normal-conducting metal solder which has a non-zero resistance at the operating temperature of the circuit, such as lead-tin (PbSn) or indium-silver (InAg) alloys. In some embodiments of the technology, the switch may be constructed such that there are no joints between the branches, for example the branches may be formed by splitting a continuous strip of superconducting material or tape so as to make two integrally joined branches.

Preferably, the branches of superconducting material may further each comprise one or more coils of superconducting material. For example, the first branch may comprise at least one coil and the second branch may comprise at least one coil. Use of superconducting coils may advantageously enable greater coupling between the magnetic field generator and the loop. In alternative embodiments, coils may not be used.

It should be appreciated that each coil of superconducting material may comprise one or more turns. These turns may be positioned around a common axis. Providing the one or more turns around a common axis may advantageously allow for a simpler construction and/or greater coupling between the varying magnetic field generator and the superconducting material.

Where coils are used, it may be advantageous for the coil(s) in each branch of the loop to be wound in counter-rotating directions (i.e. one coil taking the form of a right handed helix and the other coil taking the form of a left handed helix). For example, the coil in a first branch of the two branches may be wound in a clockwise direction, while the coil in a second branch of the two branches may be wound in an anticlockwise direction. In other words, the coils in the first branch may be wound in a first rotation direction, and the coils of the second branch may be wound in a second rotation direction, wherein the first rotation direction is different to the second rotation direction. This arrangement may advantageously further encourage the generation of a screening current in the loop. Furthermore, by counter-winding the coils it may be possible to counteract or minimise the total inductance between the terminals of the switch.

Preferably, the magnetic field generator may comprise a supply in the form of an alternating power source such as an AC current or voltage source. For example, the magnetic field generator may comprise an alternating power source which is magnetically coupled to the loop of superconducting material via one or more turns of a conductor.

Preferably, the magnetic field generator may be magnetically coupled to the loop of superconducting material by a core. In preferred embodiments, the core is a magnetic or ferrous core containing iron or ferrite, however in alternative embodiments the core may be a non-magnetic or air core as will be known to those skilled in the art. The use of a ferrite core may be particularly advantageous where the switch is used at high frequencies.

In embodiments where a magnetic core is used it may be advantageous for the magnetic core to consist of a closed loop of magnetic material. Use of a closed loop may better enable the magnetic field generated by the magnetic field generator to be magnetically coupled to the branches of the superconducting material.

Preferably, the magnetic field generator may include a magnetic field generator coil consisting of one or more turns of a conductor. This generator coil may be arranged to generate a magnetic field in the core, by coupling the current from the alternating power source to the core via the one or more turns. For example, the generator coil may include one or more turns which are wrapped around the core. The magnetic field generated in the core may be magnetically coupled to the loop of superconducting material by looping the superconducting material around at least a portion of the core. Furthermore, where coils are added to the loop of superconducting material as described herein, these coils may be used to couple the magnetic field into the superconducting loop. In other words, the coils may be wound around the magnetic core in order to increase the magnetic coupling between the magnetic field generator and the superconducting loop.

In other forms of the technology the magnetic field generator coil may be positioned inside the loop and/or coils of superconducting material. Alternatively, the generator coil may be wound around the loop and/or coils of superconducting material. In a yet further alternative, the generator coil may be positioned along a common axis to the loop and/or coils. In each of the aforementioned arrangements it may be preferable for the generator coil and superconducting loop and/or coils to be coaxial with one another. In other words, the generator coil is arranged so that an axis of the generator coil is generally parallel to the axis of the superconducting loop and/or coils of the loop, and the direction of the magnetic field generated by the generator coil through the loop and/or coils is generally parallel to the axis of the loop. It should be further appreciated that in embodiments of the technology where coils are not used, the above arrangements may apply to the loop only.

Preferably, the conductor used in the generator coil may be a non-superconducting material such as copper or aluminium. The use of a non-superconducting material may advantageously allow for a low-cost magnetic field generator. However, this should not be seen as limiting on the technology and in alternative embodiments the generator coil may comprise one or more superconductors such as yttrium barium copper oxide (YBCO).

Preferably, the magnetic field generator is configured to generate a time-varying magnetic field through the loop in a direction which is substantially parallel to the axis of the loop. Passing the time-varying magnetic field through the loop in a direction which has a substantially parallel component may advantageously be more efficient than passing the magnetic field through the one or more of the conductors of the loop.

In one or more embodiments of the technology, the transport current passing between the terminals of the electrical switch may be a direct current (DC). In alternative embodiments alternating currents (AC) may be used.

Preferably, the magnetic field generator may be configured such that, when it is activated, it induces a screening current in the branches which is sufficient to cause resistive dissipation in the superconducting material without quenching. It should be appreciated that quenching of the superconducting material occurs when the temperature exceeds the critical temperature. Accordingly, it is possible for the total current in the superconducting material to exceed the critical current for the superconductor without quenching provided that there is sufficient cooling to keep the superconducting material below the critical temperature. In other words, if local heat dissipation in the superconducting material exceeds the rate at which heat can be removed, then it will likely quench. For example, in one or more applications of the technology, it may be beneficial to operate the superconductor in its unquenched state. Particularly in applications where fast switching speeds are required, such as the switch component in a rectifier.

In an alternative embodiment of the technology, the magnetic field generator may be configured such that, when it is activated, it induces a large enough screening current in the branches such that the total energy dissipation in a branch is sufficient to quench the superconducting material. While quenching of the superconducting material is a function of the cooling of the system, it should be appreciated that in one or more embodiments the quenching of the superconducting material may be configured to occur when the sum of the transport current and screening current is equal to or greater than the critical current of the superconducting material. This quenched state may be particularly advantageous when the electrical switch is used in a fault current limiter, as it may be possible to generate higher current limiting resistances.

Preferably, when the magnetic field generator is de-activated, the magnetic field generator may generate substantially no magnetic field or a constant magnetic field or otherwise generate a magnetic field which is insufficient to induce a screening current which increases the resistance of the branches.

Preferably, when in the low-resistance state the branches of the superconducting material may be superconducting. For example, it may be advantageous for the branches of the superconducting material to have substantially zero resistance in the low-resistance state. It should be appreciated that the join between the branches of superconducting material may have some non-zero resistance as described herein while still being incorporated within forms of the technology.

Preferably, when the magnetic field generator is active, the branches may be in a higher-resistance state which is still superconducting. For example, it may be advantageous for the branches of the superconducting material to be superconducting, while still having a resistance which is higher than the resistance of the superconducting material in the low-resistance state. However, this should not be seen as limiting on the invention, for example in the higher-resistance state the branches of superconducting material may be non-superconducting, for example the superconducting material may have quenched or the current may otherwise exceed the critical current of the superconductor.

According to a further aspect of the technology, there is provided a rectifier comprising an electrical switch as described herein and a control mechanism configured to control each of the at least one electrical switch between the low-resistance state and the higher-resistance state in order to rectify current from an alternating current source.

Preferably, the rectifier comprises a transformer comprising a primary side and a secondary side, wherein the at least one electrical switch is connected to the secondary side of the transformer. The control mechanism may control each of the at least one electrical switch between the low-resistance state and the higher-resistance state based on the direction of flow of an alternating current in the transformer. For example, the control mechanism may be configured to control the at least one electrical switch based on the direction of flow of alternating current in the primary side of the transformer.

In one embodiment the rectifier may be a half-wave rectifier. In alternative embodiments the rectifier may be a full-wave rectifier.

Preferably, the rectifier may comprise one or more switches according to the present technology.

According to a further aspect of the technology, there is provided a fault current limiter comprising an electrical switch as described herein and a control mechanism configured to put the at least one electrical switch in the higher-resistance state when a fault is detected.

Preferably, the fault current limiter may comprise one or more switches according to the present technology.

It should become apparent from the foregoing description that the present technology may provide one or more advantages over conventional switches including:
  Higher switching resistance, i.e. higher resistance (superconducting or not) in the higher-resistance state while remaining superconducting in the low-resistance state;
  A more compact switch, particularly in embodiments where the generator coil and superconducting coil are co-axially aligned;
  A switch which is able to operate using a smaller magnetic core than previous switches, as the resistance is generated in the superconducting loop;
  A more efficient switch which is further able to have reduced overall losses in a cryogenic system;
  A lower cost, simpler construction than existing superconductor switches;
  A switch which is able to transition between the low-resistance state and the higher-resistance state more quickly than existing switches;
  A switch which allows for smaller magnetic field generator currents and voltages than existing switches. Particularly in embodiments where the switch is non-inductive or otherwise has a low inductance;
  A switch construction which is operable with a smaller magnetic field generator coil size as the magnetic field does not need to be applied in a direction which is normal to the surface of the superconductor;
  A switch which is operable using a smaller applied magnetic field as the field does not need to penetrate the superconducting material; and
  A switch which is able to mitigate or otherwise reduce the occurrence of localised hot spots in the superconductor.

Further aspects of the technology, which should be considered in all its novel aspects, will become apparent to those skilled in the art upon reading of the following description which provides at least one example of a practical application of the technology.

BRIEF DESCRIPTION OF THE DRAWINGS

One or more embodiments of the technology will be described below by way of example only, and without intending to be limiting, with reference to the following drawings, in which.

DETAILED DESCRIPTION OF PREFERRED EMBODIMENTS OF THE INVENTION

Background

To aid in the understanding of the present technology the reader should be familiar with superconducting terminology including the:

Critical temperature for a superconductor; and

Critical current for a superconductor.

Nevertheless, for the benefit of the reader we briefly discuss these concepts below.

The critical temperature for a superconductor is conventionally defined as the temperature, below which the conductivity of the superconductor drops to zero or near zero. In other words, a superconductor is said to be in its superconducting state when the temperature of the superconductor is below the critical temperature and in a non-superconducting state when the temperature is above the critical temperature. Many superconductors have a critical temperature which is near absolute zero; for example, mercury is known to have a critical temperature of 4.1 K. It is however also known that some materials can have critical temperatures which are much higher such as 30 to 125 K; for example, magnesium diboride has a critical temperature of approximately 39 K, while yttrium barium copper oxide (YBCO) has a critical temperature of approximately 92 K. These superconductors are often generally referred to as high-temperature superconductors (HTS).

The critical current for a high-temperature superconductor wire or tape is conventionally defined as the current flowing in a superconductor wire/tape which results in an electric field drop along the wire of 100 µV/m (=1 µV/cm).

It should be appreciated that the critical current is a function of both the superconducting material used, and the physical arrangement of the superconducting material. For example, a wider tape/wire may have a higher critical current than a thinner tape/wire constructed of the same material. Nevertheless, it should be understood that, throughout the specification, reference to the critical current of the superconductor/superconducting material is made to simplify the discussion.

In a superconductor/superconducting material, if the current, I is approximately equal to the critical current $I_c$, the resistance of the superconductor is non-zero, but small. However, if I is much larger than the critical current $I_c$, the resistance of the superconductor becomes sufficiently large to cause heat dissipation which can heat the superconductor to a temperature above its critical temperature, which in turn causes it to no longer be superconducting. This condition is sometimes referred to as a "quench" and can be damaging to the superconductor itself. Some fault current limiters use the quenching effect of superconductors to obtain a rapid, one-off switching of a large resistance into a power circuit. These fault current limiters are generally able to be reset and reused, however this is typically a slow process due to the required recooling of the superconducting material to below its critical temperature.

Figure 1:
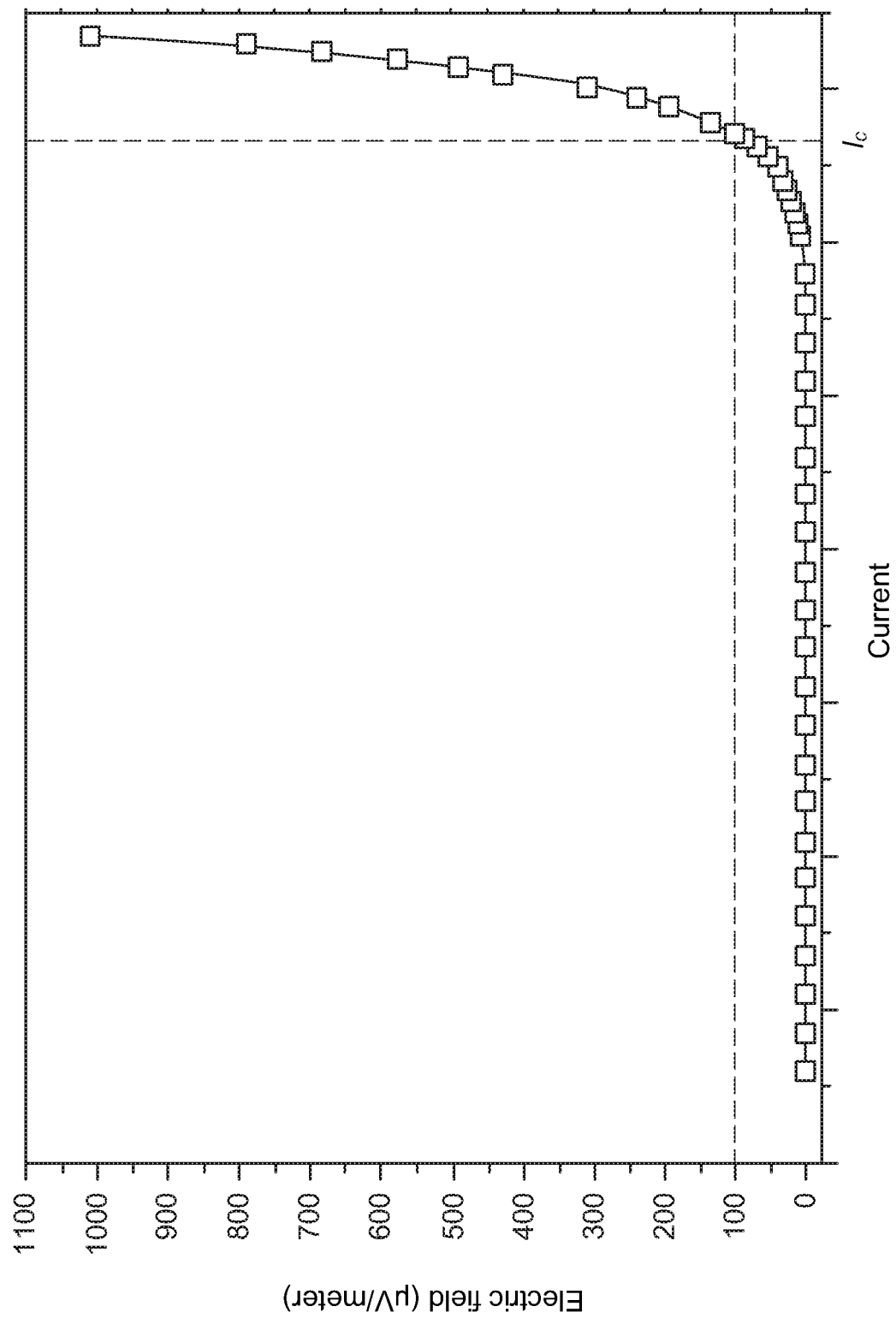
FIG. 1 shows an exemplary electric-field versus current graph for a high-temperature superconductor.

FIG. 1 shows an exemplary plot depicting the internal electric-field versus current curve for a high-temperature superconductor. It should be appreciated that the electric-field shown in this plot is related to resistance via the following equation:

$$E = \frac{IR}{L}$$

Where:

E is the electric field;

I is the current through the superconductor;

R is the resistance of the wire; and

L is the length of the wire.

Accordingly, the plot of FIG. 1 is related to the resistance per-unit length for the superconductor and, because the curve depicted is non-linear, the resulting resistance for the superconductor is non-linear with current.

In this figure it can be seen that the electric field strength in the superconductor is substantially zero below the critical current ($I_r$) for the superconductor. As the current in the superconductor approaches the critical current, the electric-field in the superconductor starts to increase. At the critical current, the electric-field in the superconductor is 100 µV/m. Further increasing the current in the superconductor above the critical current results in rapid increases in the electric-field strength in the conductor.

It should be appreciated that throughout the present specification reference will be made to the relative resistances of a superconducting switch and components thereof. It should be appreciated by those skilled in the art that superconducting materials when in a superconducting state can have a resistance which is zero or substantially zero, and as such these resistances are more commonly expressed in terms of the electric field present across the superconducting material for a given current. Nevertheless, throughout the present specification, reference has been made to relative resistances, low-resistance and higher-resistance states in order to simplify the foregoing discussion.

Forms of the Technology

Figure 2A:
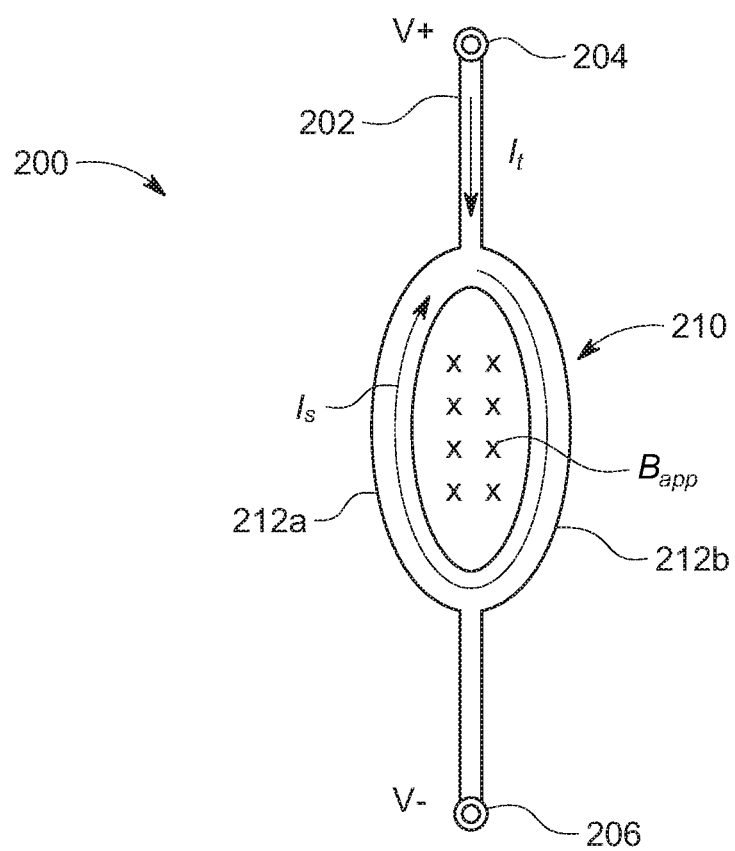
FIG. 2A illustrates a first embodiment of a switch according to the present technology.

FIG. 2A is a schematic view of a switch 200 according to the present technology.

The switch 200 includes a superconducting material 202 which is connected between a first terminal 204 and a second terminal 206. In describing the technology in this specification, the switch, including components thereof are referred to as "superconducting". It should be apparent to those skilled in the art that this term is not intended to be limiting on the scope of the technology, and it should be appreciated that under certain conditions the switch and components thereof may not be in a superconducting state, i.e. the switch may be described as superconductive but not superconducting. Nevertheless, for sake of consistency, the switch and components thereof may be described throughout the present specification as "superconducting".

In the preferred embodiment of the invention the superconducting material 202 comprises a rare-earth barium copper oxide (ReBCO) tape, for example an yttrium barium copper oxide tape, or a gadolinium barium copper oxide tape. However, this should not be seen as limiting on the invention, and it should be understood that the present invention is compatible with other superconducting materials, including high-temperature superconductors, and that the use of tapes should not be seen as limiting.

In use a transport current $I_t$ is selectively supplied to flow between the first terminal 204 and second terminal 206. In other words, the transport current $I_t$ may be turned off and on as required.

It should be appreciated that, in FIG. 2A, the first terminal 204 is illustrated as a positive terminal, and the second terminal 206 as a negative terminal for the sake of simplifying the foregoing discussion. Similarly, the transport current $I_t$ is shown as flowing from the first (positive) terminal 204 to the second (negative) terminal 206 as would be expected for conventionally defined direct current (DC) voltages. However, the use of DC voltages should not be seen as limiting on the technology as should become apparent from the foregoing discussion. It should be further appreciated that, where DC currents are used, the superconducting material experiences a negligible loss due to the low, zero or near-zero resistance of the superconducting material 202. Where AC currents are used the losses may generally be higher due to parasitic effects, although the total losses are significantly smaller than equivalent non-superconducting material.

The superconducting material 202 between the two terminals 204, 206 is formed in a loop 210 which comprises two electrically parallel superconducting branches 212a, 212b.

These superconducting branches 212a, 212b may be formed by joining two or more superconducting materials together using methods known to those skilled in the art, including methods which provide a non-zero joint resistance. Alternatively, the branches 212a, 212b may be formed using any method which provides a substantially zero resistance joint, such as by splitting a superconducting tape into two parallel branches.

In use a transport current is applied between the first terminal 204 and second terminal 206, using an electrical circuit (not shown) connected between the first 204 and second 206 terminals. This electrical circuit may include a power source, such as voltage or current source, a transformer or any other suitable electronic circuit as should be known to those skilled in the art. A time-varying magnetic field $B_{app}(t)$ is then selectively applied to, or within, the loop 210 in a direction which is normal to (or has a component which is normal to) the plane of the loop 210, i.e. parallel to an axis of the loop 210 where the axis is normal to the plane of the loop 210. In FIG. 2, the time-varying magnetic field is applied to the loop 210 such that the magnetic field passes through the loop 210. It may be advantageous to provide the time-varying magnetic field in a direction which is substantially or at least partially normal to the plane of the loop so as to reduce losses which would otherwise be incurred due to the magnetic field penetrating or attempting to penetrate the superconductive material 202.

This time-varying magnetic field $B_{app}(t)$ causes a screening current ($I_s$) to flow around between the branches 212a, 212b of the loop 210 in order to oppose the flux change in the loop 210. This screening current $I_s$ adds to the transport current flowing around the loop 210 and as a result the total current flowing increases. This increase in current may result in a marginal increase in the resistance of the superconducting material (for example when the current is less than the critical current $I_c$ as shown in FIG. 1), or a substantial increase in the resistance of the superconducting material (for example when the current $I_c$ is near to, greater than, or equal to the critical current for the superconductor as shown in FIG. 1).

Figure 2B:
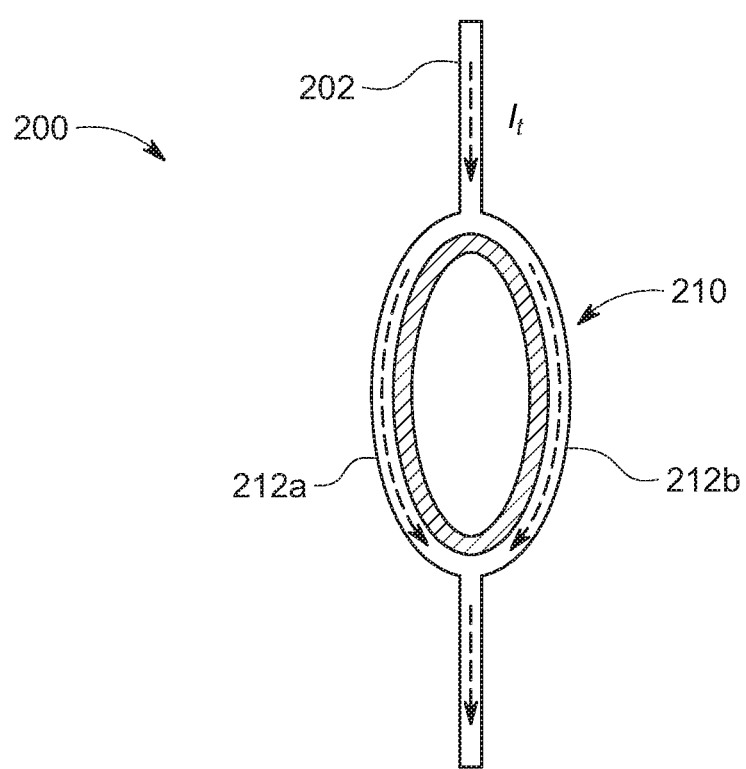
FIG. 2B illustrates the switch of FIG. 2A in a low-resistance state.
Figure 2C:
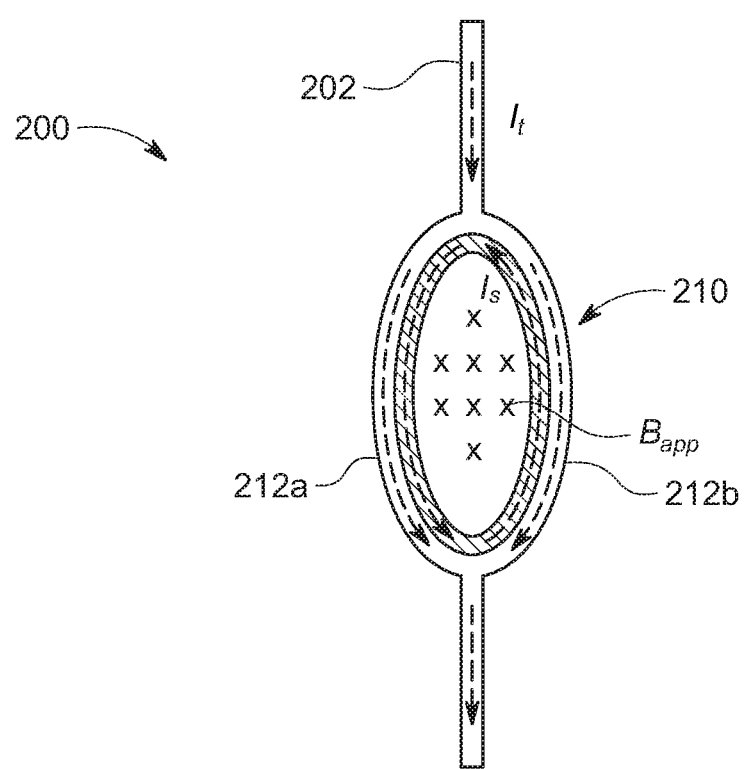
FIG. 2C illustrates the switch of FIG. 2A in a higher-resistance state.

Referring now to FIG. 2B which illustrates how the switch 200 of FIG. 2A behaves in the absence of a time-varying magnetic or in the presence of a non-time-varying magnetic field or weak time-varying magnetic field. It can be seen in FIG. 2B that the current flowing through the loop 210 is substantially equal to the transport current $I_t$. As the time-varying magnetic field is applied, or the magnitude of the magnetic field is increased or decreased, a screening current $I_s$ flows around the loop 210 as shown in FIG. 2C. If the sum of the transport current $I_t$ and screening current $I_s$ in any one of the branches 212a, 212b approaches or exceeds the critical current of the superconductor, the effective resistance of the branches 212a, 212b increases. As a result, the time-varying magnetic field can be applied to transition the switch between a low-resistance state and a higher-resistance state.

The low-resistance state of the switch 200 can be considered equivalent to the closed state of a switch 200 while the higher-resistance state is similar to an open state of a switch 200. It should be appreciated however that the higher-resistance state is not an electrical open-circuit as would be common for a mechanical switch but rather represents a higher-resistance conductive state for which the loop remains in the superconducting state, unless subsequent heating above $T_c$ also occurs.

In some embodiments, the low-resistance state may be a superconducting state wherein the resistance of the branches 212a, 212b of the loop 210 are close to or substantially zero. That is to say that in a preferred embodiment, the low-resistance state of the switch has at least a portion of the loop 210 in a superconducting state. However, this should not be seen as limiting on the technology and in alternative embodiments the low resistance state may be a partially superconducting state. For example where one or more low resistance joints are formed between superconducting elements of the loop, by normal conducting metal soldered joints.

Similarly, the high-resistance state may be a superconducting state wherein the resistance of the branches 212a, 212b of the loop 210 are close to zero, but greater than the resistance in the low-resistance state. In one application for the present technology, the resistance of the branches 212a, 212b of the loop 210 in the high-resistance state may be substantially non-zero. For example, the loop 210 may be in a non-superconducting state or in a partially superconducting state.

It should therefore be appreciated that the present technology provides a switch which is able to transition between a low-resistance state and a high-resistance state when exposed to a time-varying magnetic field or when the amplitude of a time-varying magnetic field is varied. This advantageously may allow for construction of a faster switching, non-contact switch which may be more reliable than traditional current switches. Other potential advantages include the ability to create switching elements which are:

More compact than traditional switches, as will become apparent from the foregoing discussion;

Faster switching than thermal switches, particularly in applications where the higher-resistance state of the switch is a superconducting state;

Able to achieve higher off resistances than existing AC-field controlled switches;

More efficient than traditional switches as there is reduced dissipation in the superconductor due to the exclusion of the magnetic field from the superconductor;

More reliable than existing switches as the switch is non-contact and has lower dissipation; and Lower inductance which allows for lower power driving sources for the magnetic field generator.

Figure 3:
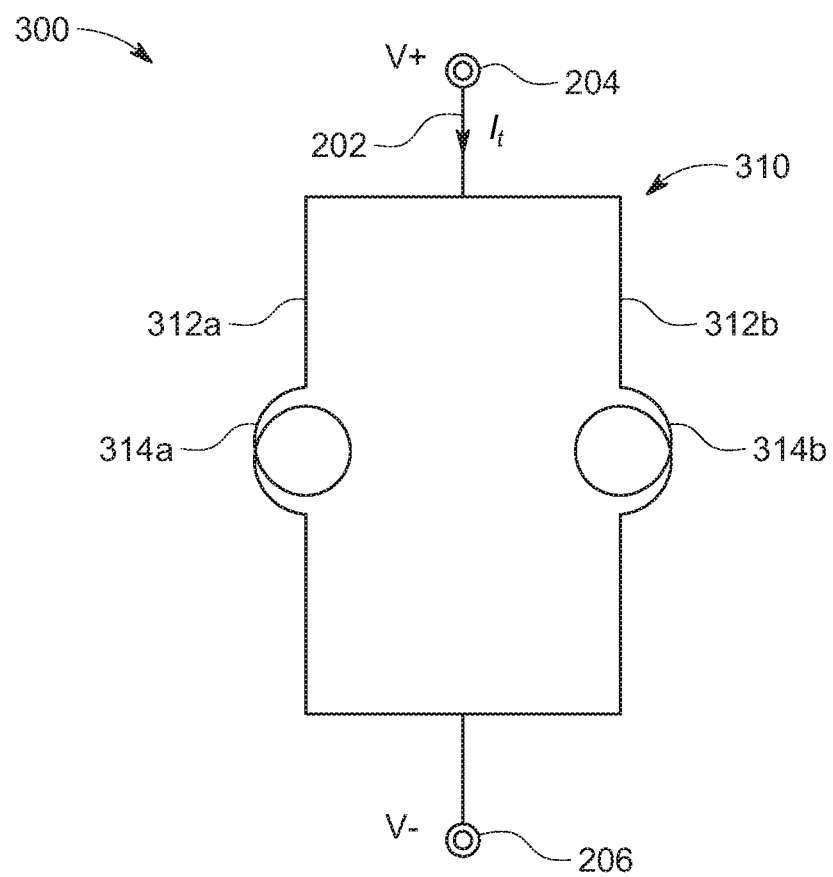
FIG. 3 illustrates a further embodiment of a switch according to the present technology.

A further embodiment of a switch 300 according to the present technology is illustrated in FIG. 3. Like the previously described embodiment, the superconducting material 202 has been arranged in a loop 310 that includes two electrically parallel branches 312a, 312b. However, in this embodiment, each branch 312a, 312b includes a coil 314a, 314b of superconducting material and each coil comprises one or more turns.

It should be understood with reference to the figures and foregoing description that the loop of the present technology comprises two or more electrically parallel conductive paths. In contrast the coils of the present technology each have a singular conductive path consisting of one or more turns.

In use, a time-varying magnetic field $B_{app}$ is selectively applied through the loop 310 across both coils 314a, 314b in a direction which is normal to (or has a component which is normal to) the plane of the loop 310 and/or coils 314a, 314b. This causes a screening current $I_s$ to flow around the closed loop 310 formed by the two parallel-connected branches 312a, 312b. This screening current can be used to selectively transition the switch 300 between a low-resistance and a higher-resistance state, as per the previous embodiments.

It may be desirable for the first branch 312a to include one or more coils 314a which are wound in a clockwise direction, while the second branch 312b includes one or more coils 314b which are wound in an anticlockwise direction or vice versa. This arrangement can be useful to ensure that the screening current in the first coil 314a is induced in the same direction as the screening current in the second coil 314b, thereby encouraging the screening current to flow around the loop 310. Furthermore, the use of coils 314a, 314b may advantageously make it easier to practically equalise the inductance of each branch 312a, 312b. For example, by using coils 314a, 314b having one or more turns, the geometric differences between each branch 312a, 312b, become a smaller fraction of the number of current-turns in each branch.

A further potential advantage of this arrangement is that it may allow for higher switching resistances than the previous embodiment due to the longer switching lengths in each branch.

Figure 4:
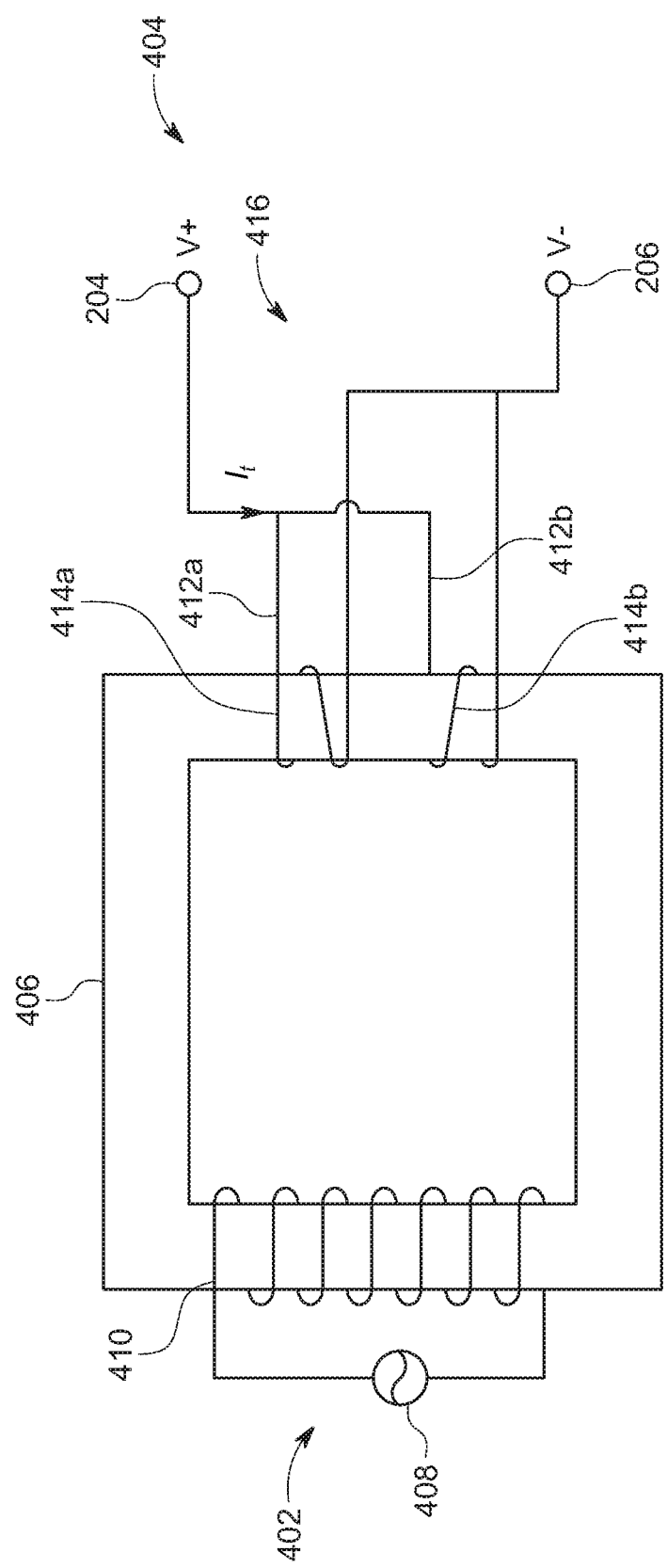
FIG. 4 shows a method of coupling a magnetic field generator to a switch according to the present technology.

FIG. 4 is a schematic illustration showing one practical application for the switch 300 of FIG. 3. In this embodiment the coupling between the varying magnetic field generator 402 and the switch 404 may be improved by directing the magnetic flux through a core 406. In this way the arrangement of FIG. 4 resembles that of a transformer as should be well known to those skilled in the art.

The core 406 is preferably a high-permeability magnetic core such as an iron core, however this should not be seen as limiting on the technology as will become apparent from the foregoing discussion.

For sake of simplicity the magnetic field generator 402 is illustrated as an AC source 408 which is magnetically coupled to the core via a coil 410 that includes one or more turns. This however should not be seen as limiting on the technology and alternative methods of generating a varying magnetic field may be used for example by switching a DC current source.

To simplify the foregoing discussion, and to distinguish the coil 410 of the magnetic field generator from the coils 414a, 414b of the switch 402 reference herein will be made to the coil 410 of the magnetic field generator as a magnetic field generator coil 410, or simply generator coil.

It should also be appreciated that the magnetic field generator coil 410 may be constructed of any suitable conductive material including superconducting materials such as YBCO or non-superconducting materials such as copper and aluminium. In a preferred embodiment the generator coil 410 is constructed of copper. This may advantageously provide a lower-cost switch than similar switches that use superconducting generator coils 410.

To continue the transformer analogy, the generator coil 410 could be considered the primary side of the transformer, while the coils 414a, 414b of the switch could be considered the secondary side of the transformer.

Unlike a traditional transformer however the superconducting coils 414a, 414b of the switch 404 are wound around the core 406 in counter-rotating directions, and electrically connected in parallel with one another. As a result, the secondary winding coils are shorted and the net flux enclosed by coils 414a and 414b is approximately zero if coils 414a and 414b each have the same number of turns. The purpose of the core 406 is to couple the applied magnetic field to the pair of coils 414a and 414b that form the loop 416. This results in a screening current being generated in the loop 416 to oppose the flux changes from the magnetic field generator 402.

In use, the magnetic field generator 402 may be selectively enabled, or otherwise varied in amplitude as required to transition the switch 404 between the low-resistance and higher-resistance states.

In the low-resistance state, where the magnetic field generator 402 is not generating a varying magnetic field in the core 406, or otherwise is generating a weak magnetic field in the core 406, the transport current $I_t$ tends to be shared evenly between the two parallel branches 412a, 412b. In this state, these branches 412a, 412b have zero, or close to zero resistance, and furthermore, as the coils 414a, 414b are wound in counter-rotating directions there is little inductance present across the terminals 204 and 206. Furthermore, as the coils 414a, 414b are wound in counter-rotating directions and connected in parallel there is also substantially zero or otherwise very minimal flux induced into the core 406 from the coils 414a, 414b.

When the magnetic field generator 402 is activated, or the magnitude of the applied magnetic field is increased or decreased, a screening current $I_s$ is formed in the loop 416 of superconducting wire as described above. If the sum of the transport current $I_t$ and the screening current $I_s$ in one or both of the branches 414a, 414b is close to, equal to, or exceeds the critical current of the superconducting material, there will be a non-zero resistance in the branch(es). Accordingly, the magnetic field generator 402 may be activated, or alternatively the amplitude of the magnetic field generator varied, to switch the switch 404 between a low-resistance and a higher-resistance state.

Figure 5:
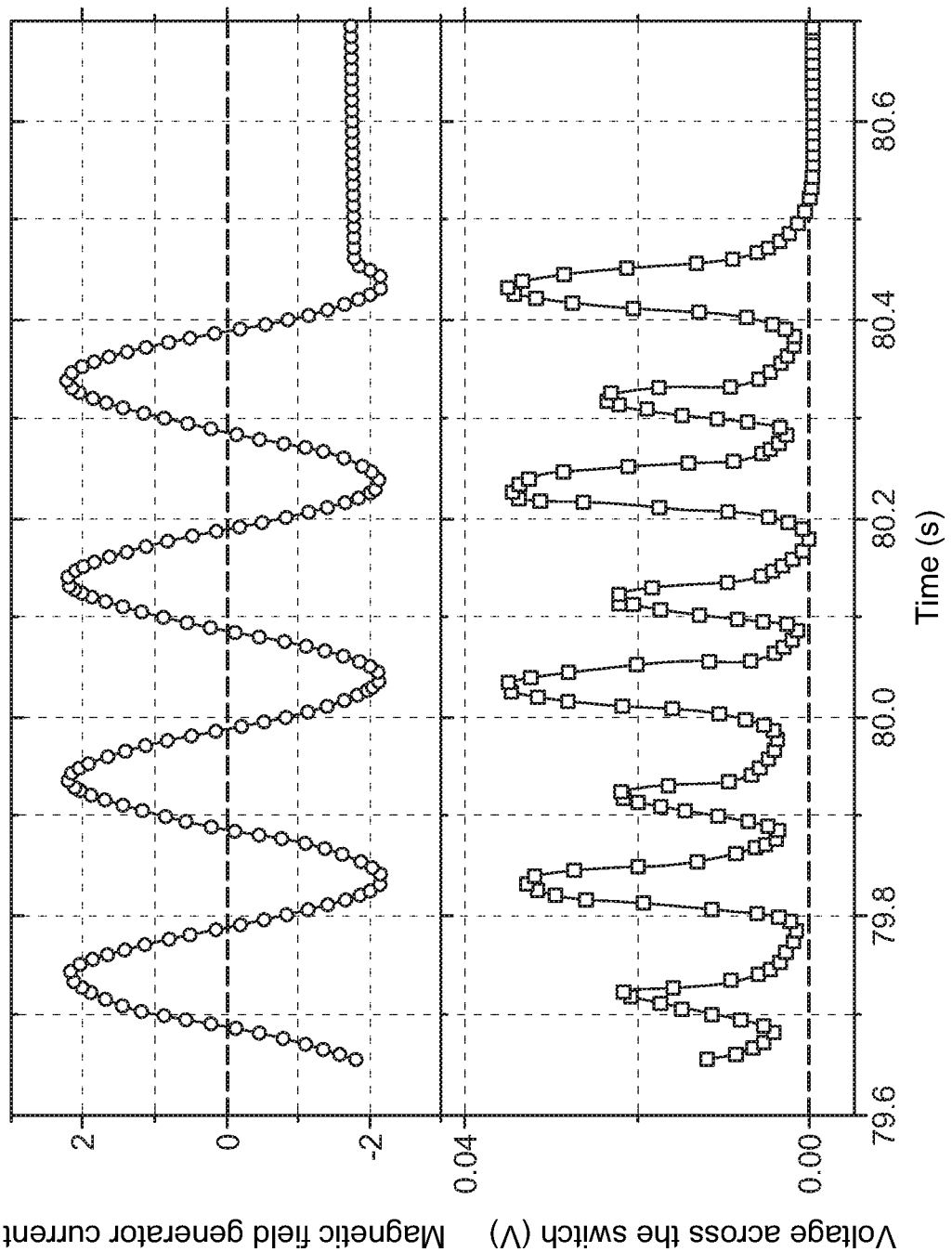
FIG. 5 shows a graph which compares the voltage measured across the terminals of a superconducting switch in the presence of and absence of a varying magnetic field.

FIG. 5 shows a measured example of the voltage across the terminals 204, 206 of a switch according to one form of the present technology. In this figure, the voltage across the switch is the voltage measured between the terminals 204, 206 of the switch. The magnetic field generator current reflects the amplitude of the current applied to the generator coil 410 by the magnetic field generator 402.

For sake of completeness, it is noted that a DC current of approximately 80 Amps was applied across the terminals 204, 206 using a current source. The superconducting coils 414a, 414b each consisted of a single turn of a 4 mm wide YBCO tape, and the generator coil used 200 turns of copper wire.

It can be seen that, in the absence of a varying magnetic field (approximately 80.5 seconds onwards), the voltage measured across the terminals 204, 206 was substantially zero. In other words, in the absence of a time-varying magnetic field, the superconducting material is superconducting. This represents the low-resistance state of the switch. In contrast when the varying magnetic field was applied (prior to 80.5 seconds) the voltage measured across the terminals fluctuated, representing a change in the resistance of the superconductive material. In addition, the peak voltage across the terminals was observed when this varying magnetic field was applied. This represents the higher-resistance state of the switch. It should be appreciated that this higher-resistance state of the switch may represent a superconducting or non-superconducting state, depending on the intended application of the switch.

Figure 6:
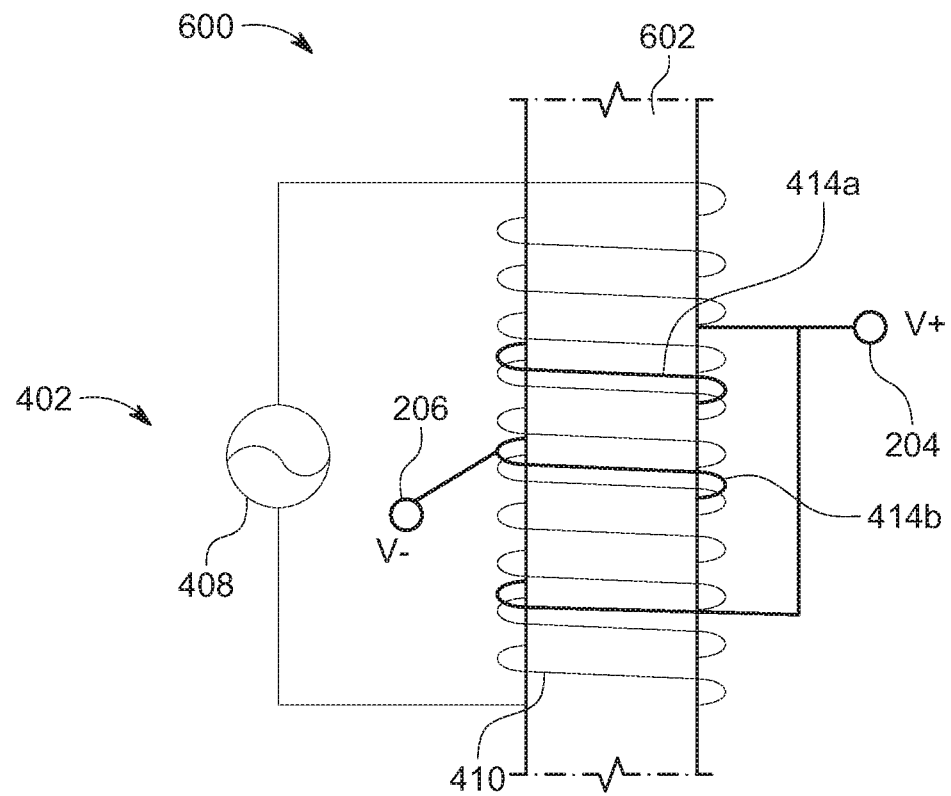
FIG. 6 shows an alternative method of coupling a magnetic field generator to a switch according to the present technology.

FIG. 6 shows a yet further embodiment of a switch 600 according to the present technology. In this embodiment, the generator coil 410 of the varying magnetic field generator 402 is coaxially aligned with the coils 414a, 414b of the switch 600. This may advantageously improve the magnetic field coupling between the generator coil 410 and the superconducting coils 414a, 414b, of the switch 600.

In the illustrated embodiment, the turns of the superconducting coils 414a, 414b of the switch 600 are interlaced with the turns of the generator coil 410. However, this should in no way be seen as limiting on the technology. For example, the superconducting coils 414a, 414b may be positioned axially inside those of the generator coil 410. Alternatively, the generator coil 410 may be located axially inside the superconducting coils 414a, 414b. In a yet further alternative, the generator coil 410 may be longitudinally spaced from the coils 414a, 414b. It is also envisaged that the first superconducting coil 414a may be positioned in an alternative location to the second superconducting coil 414b; for example, the first superconducting coil 414a may be positioned under the generator coil 410, and the second superconducting coil 414b positioned above the generator coil 410.

A further advantage of coaxially aligning the generator coil 410 and the superconducting coils 414a, 414b is that a non-magnetic core or air-core 602 may be used. This can advantageously reduce the size, weight and cost of the switch. Further advantages of using an air core, such as the ability to drive higher screening currents without saturating the core should also be apparent to those skilled in the art.

Applications of the Technology

Figure 7:
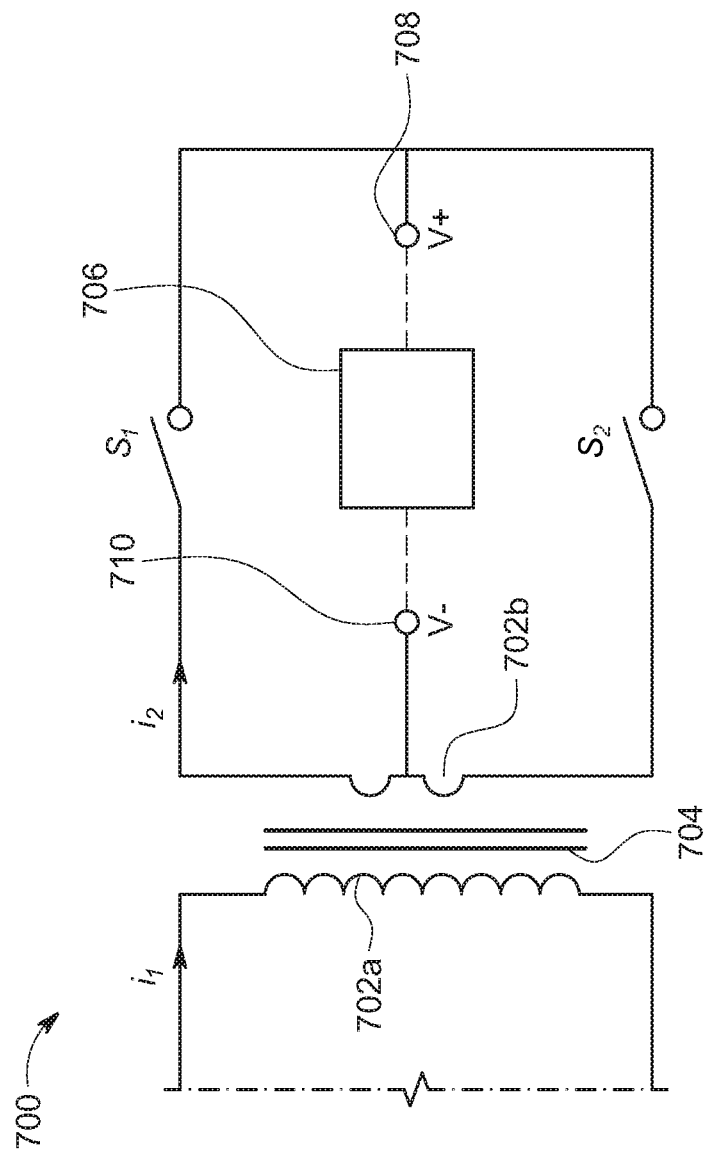
FIG. 7 shows a simplified schematic of a full-wave rectifier employing switches according to the present technology.
Figure 8:
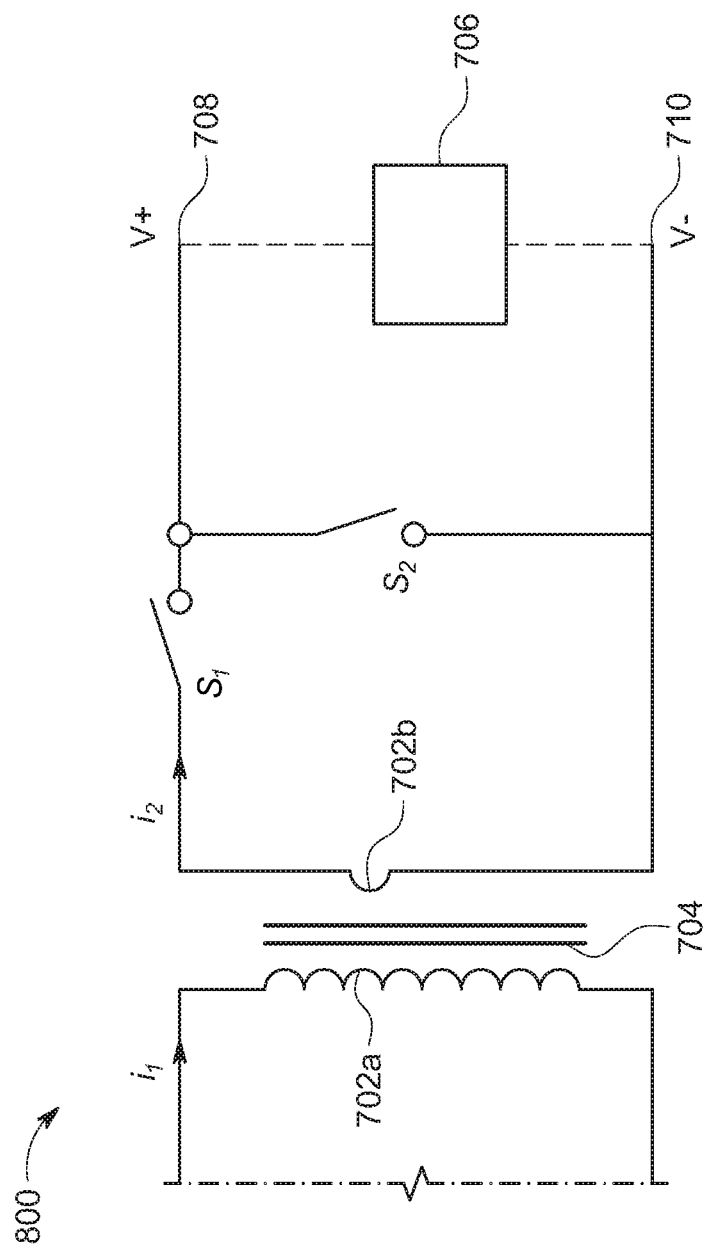
FIG. 8 shows a simplified schematic of a half-wave rectifier employing switches according to the present technology.

FIGS. 7 and 8 respectively show exemplary circuit diagrams of a full-wave rectifier 700 and a half-wave rectifier 800 according to forms of the technology. These examples represent applications for the switch of the present technology, and are in no way meant to be seen as limiting on the scope of the technology. Further applications of the switch should become apparent to the skilled addressee, in particular it is envisaged that the superconducting switch of the technology may be an improvement of existing current switches, and may find application in superconducting magnets, magnetic resonance imaging (MRI), nuclear magnetic resonance (NMR), flux pumps, fault current limiters and magnetic energy storage systems. Alternatively, the switch of the present invention, may be used to replace traditional switches such as AC-field switches, semiconductor switches and/or mechanical switches in a wide range of applications.

In these embodiments, the switches $S_1$, $S_2$ have been represented symbolically to simplify the foregoing discussion. It should however be appreciated, that these switches $S_1$, $S_2$ may be constructed using any of the methods described herein. Furthermore, for the purposes of simplifying the foregoing discussion it is assumed that both switch symbols represent superconducting switches according to the present technology. However, it should be appreciated that one or more of the switches illustrated may instead be a traditional switch such as an AC-field switch, a semiconductor switch such as a transistor, a mechanical switch such as a relay or a resistor.

Referring firstly to FIG. 7, it can be seen that the overall circuit topology is that of a known full-wave rectifier 700. A transformer 704 has a primary side 702a comprising at least one coil and a secondary side 702b comprising at least one coil. An alternating current source is provided to the primary side 702a. Two switches $S_1$, $S_2$ are connected to the secondary side 702b of the transformer 704. A load 706 is connected in parallel with the switches $S_1$, $S_2$ between a first terminal 708 and a second terminal 710. The first terminal 708 is connected to a middle winding of the secondary side 702b of the transformer 704, for example via a common centre tapped connection.

The general principle of this circuit should be well known to those skilled in the art, however we briefly summarise the operation for sake of clarity.

In use an alternating current I is applied to the primary side 702a of the transformer 704. This current induces a current flow $I_2$ in the secondary side 702b of the transformer. The ratio of the primary side 702a current to the secondary side 702b current is a function of the ratio of the number of turns on the primary side 702a of the transformer 704 to the number of turns on the secondary side 702b of the transformer 704 as should be known to those skilled in the art.

The rectifier 700 comprises a control mechanism (not shown). The control mechanism is configured to control the state of each of the switches $S_1$, $S_2$ in order to rectify the alternating current source. For example, the control mechanism controls each of the switches $S_1$, $S_2$ so that the state of each switch is based on the direction of flow of the alternating current in the primary side 702a or secondary side 702b of the transformer 704. Since the direction of flow of the alternating current depends on the phase of the current, the control mechanism controls the state of each of the switches $S_1$, $S_2$ in a timed manner.

When the current in the secondary side 702b of the transformer 704 is flowing in a first direction (for example when the current is positive) the first switch $S_1$ is placed into its low-resistance state, while the second switch $S_2$ is placed into its higher-resistance state. This results in a lower impedance path around the top half of the circuit, and results in a current flow through the load 706 from the first terminal 708 to the second terminal 710. In this state, the first switch $S_1$ is in series with the load, while the second switch $S_2$ is parallel to the load. This load may be any suitable load known to those skilled in the art. For example, it may be a load coil, or a resistive element. In a yet further embodiment, the load may be large or substantially open-circuit in order to simply provide an open-circuit voltage.

One application for the present technology is to attach a superconducting coil as the load. This superconducting coil may be attached using normal-conducting soldered joints while still being incorporated within forms of the technology.

When the current in the secondary side 702b of the transformer 704 is flowing in a second direction (for example when the current is negative) the first switch $S_1$ is placed into is higher-resistance state, while the second switch $S_2$ is placed into a low-resistance state. In this state, the first switch $S_1$ is in parallel with the load, while the second switch $S_2$ is in series with the load. This results in a lower impedance path around the bottom half of the circuit, and results in a current flow through the load 706 from the first terminal 708 to the second terminal 710.

In this way, irrespective of the direction of the current induced into the second side 702b of the transformer 704, the current always flows through the load in a single direction, from the positive terminal to the negative terminal. Accordingly, the alternating current of the primary side 702a of the transformer 704 is full-wave rectified into a direct current through the load 706.

In examples, the control mechanism may be configured such that on transitioning the switches $S_1$, $S_2$ from the higher-resistance state to the low-resistance state or vice-versa, the control mechanism may first transition both switches $S_1$, $S_2$ to a higher-resistance state temporarily in order to reduce any short-circuit or "crowbar" currents which may otherwise be present during switching.

It should be appreciated that the full-wave rectifier may be constructed in such a way that the current path on the secondary side 702b is substantially superconducting. This may advantageously provide a full-wave rectifier which is more compact or otherwise more efficient than existing designs. It should further be appreciated that the rectifier may also include non-superconducting components while maintaining a substantially superconducting secondary side current path. For example, the primary side 702a of the transformer may be constructed using non-superconducting materials such as copper or aluminium and the generator coils (not shown) of the switches $S_1$, $S_2$ may also employ non-superconducting components as described herein. Furthermore, the joints between any of the components of the technology including those of the superconducting elements may be formed using non-superconducting materials such as metal solder while still being incorporated within forms of the technology.

It should be understood that, in rectifier applications it may be important that the switching time between high and low resistance states is short. In these applications, it may be preferable for the superconducting material to remain below its critical temperature, as quenching of the superconducting material can introduce a thermal time lag after switching during which the superconductor must cool back down to its operating temperature.

Referring now to FIG. 8, it can be seen that the general circuit topology is that of a known half-wave rectifier 800. A transformer 704 has a primary side 702a comprising at least one coil and a secondary side 702b comprising at least one coil. An alternating current source is provided to the primary side 702a. Two switches $S_1$, $S_2$ are connected to the secondary side 702b of the transformer 704 as shown. A load 706 is connected in parallel across one of the switches, $S_2$ in the example of FIG. 8. The load is connected between a first terminal 708 and a second terminal 710.

The general principle of this circuit should be well known to those skilled in the art, however we briefly summarise the operation for sake of clarity.

Like the previous embodiment, the primary side 702a of the transformer 704 is driven with an alternating current $I_1$ which induces an alternating current $I_2$ in the secondary windings 702b of the transformer.

The rectifier 800 comprises a control mechanism (not shown). The control mechanism is configured to control the state of each of the switches $S_1$, $S_2$ in order to rectify the alternating current source. For example, the control mechanism controls each of the switches $S_1$, $S_2$ so that the state of each switch is based on the direction of flow of the alternating current in the primary side 702a or secondary side 702b of the transformer 704. Since the direction of flow of the alternating current depends on the phase of the current, the control mechanism controls the state of each of the switches $S_1$, $S_2$ in a timed manner.

When the secondary side current $I_2$ is flowing in a first direction (i.e. the current flow is positive) the first switch $S_1$ is placed in its low-resistance state and the second switch $S_2$ is placed in its higher-resistance state. As such a low resistance path is formed around the outside of the loop, from the secondary side of the transformer 702b, through switch $S_1$ and across the load 706 from the first terminal 708 to the secondary terminal 710. As the polarity of the current changes (for example from positive to negative), switch $S_1$ transitions into its high-resistance state, and switch $S_2$ transitions to a low-resistance state. The higher-resistance state of $S_1$ impedes the current flow from the transformer, providing a measure of blocking to the negative polarity current flow. Simultaneously, the low-resistance state of $S_2$ provides a path for the current flow in the load to continue, albeit while decaying. Accordingly, the current flow through the load is half-wave rectified.

Those of skill in the art will appreciate suitable control mechanisms that enable the state of the switches $S_1$, $S_2$ in the forms of the technology illustrated in FIGS. 7 and 8 to be controlled as described. For example, the switches $S_1$ and $S_2$ may have their respective varying magnetic field generators activated in synchronicity with the polarity of the transformer current (either primary or secondary) in order to achieve the low-resistance and higher-resistance states. This may be achieved using any known control mechanisms in the art including using a half-wave rectified current signal as a means of activating the magnetic field generator. This half-wave rectified current signal may be provided as a further secondary winding on the transformer 704, or using any other method known to those skilled in the art.

It should however be appreciated that the magnetic field generators need not be activated in synchronicity with the transformer current. For example, it may be advantageous to have some dead-time (with neither $S_1$ or $S_2$ activated/in the low-resistance state) around the zero crossing for the transformer current.

It should be further appreciated that, in embodiments where multiple switches are provided such as the half-wave 800 and full-wave 700 rectifiers described herein, a single magnetic field generator may be configured to generate a screening current in one or more switches. For example, the magnetic field generator may have two or more generator coils each configured to generate a varying magnetic field across each of the respective switches. The magnetic field generator could then be configured to alternate which of the generator coils is driven based on the polarity of the current to be regulated. In such an embodiment, the control mechanism of the rectifier comprises the mechanism to control the magnetic field generator to operate in this way. Use of a single magnetic field generator in rectifier applications may advantageously reduce size, cost and/or complexity of the resulting rectifier.

Figure 9:
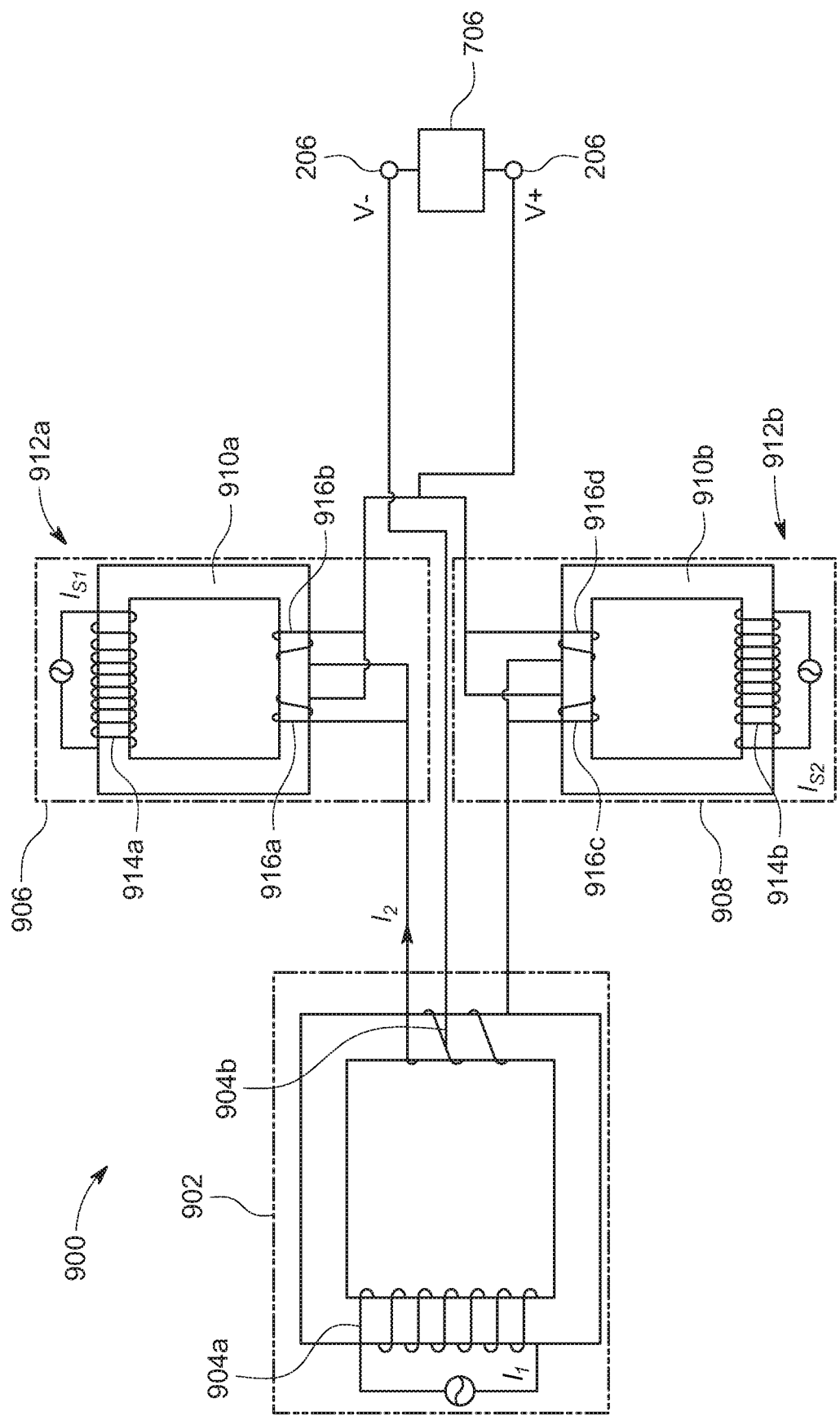
FIG. 9 shows one method of constructing a full-wave rectifier employing switches according to the present technology.

Referring now to FIG. 9 which shows an example of how the full wave rectifier 900 of FIG. 7 may be constructed according to the present technology. In this embodiment a drive transformer 902 is provided which generates the driving current or transport current $I_1/I_2$ for the circuit. In a preferred embodiment the drive transformer 902 is a step-down transformer, in other words it may be desirable for drive transformer 902 to have a greater number of turns on its primary side 904a compared to its secondary side 904b in order to achieve the high-currents used in superconducting circuits. For example, this drive transformer 902 may have a turns ratio of between 300:1 and 600:1. In the embodiment shown the transformer has approximately 900 primary turns and two secondary turns for a ratio of 450:1. Furthermore, reducing the number of turns on the secondary side 904b of the drive transformer 902 may reduce cost as comparatively few turns of expensive superconducting material are required. Using a large turns ratio may also be useful for generating a large superconducting AC secondary current using a normal-conducting primary current. Using a smaller number of primary turns to achieve this reduces the resistive losses in the primary while keeping the size small. In alternative applications where it is advantageous to reduce flux leakage, it may be advantageous to increase the number of turns on the secondary.

It should be appreciated that this drive transformer 902 substantially mirrors that of the transformer 704 of FIG. 7.

Also shown in this figure is a first switch 906 and a second switch 908. Each switch includes a coupling core 910a, 910b and a varying magnetic field generator 912a, 912b. The coupling cores 910a, 910b are used to couple the magnetic field generated in the generator coils 914a, 914b to the respective coils 916a, 916b, 916c, 916d in order to activate the switches $S_1$ and $S_2$ of FIG. 7. The cores 910a, 910b illustrated are preferably ferrite cores or laminated steel/iron cores. However, it should be understood that alternative cores with a high relative permeability at the operating frequency may also be used. In alternative embodiments of the technology, the cores may instead comprise a substantially non-magnetic material, or air-core as described in relation to FIG. 6.

In a preferred embodiment the switches 906, 908 include a greater number of turns in the generator coils 914a, 914b compared to the number of turns in the superconducting coils 916a, 916b, 916c, 916d. This ratio may advantageously allow greater flux density in the coils of the superconductor without needing a large number of turns of comparatively expensive superconducting material. For example, each switch 906, 908 may have a turns ratio of between 50:1 and 150:1. In the embodiment shown the switches 906 and 908 each have approximately 200 primary (generator coil) turns and 2 secondary (superconductor coil) turns for a ratio of 100:1.

One advantage of the construction shown in FIG. 9 is that the windings on the primary side 904a of the drive transformer are electrically isolated from the superconductor windings on the secondary side 904b of the drive transformer 902. In addition, the generator coils 914a, 914b of each switch 906, 908 are electrically isolated from the respective coils 916a, 916b, 916c, 916d of the superconducting material. This may advantageously result in a safer construction than existing rectifier circuits, and may further allow DC magnets to be charged whilst operating with a high-current.

It should be apparent to a person skilled in the art that the present topology mirrors that of FIG. 7. Accordingly, the discussion regarding the operation of FIG. 7 also applies to the embodiment of FIG. 9.

In one form a suitable control mechanism to control the timing of the change of state of the switches 906 and 908 between the low-resistance and higher-resistance states may comprise a connection between the primary current $I_1$ in the primary side 904a of the drive transformer 902 and the currents $I_{s1}$ and $I_{s2}$ in the generator coils 914a and 914b of the switches 906 and 908. Alternatively, control of the currents $I_{s1}$ and $I_{s2}$ may be based on the secondary current $I_{s2}$, or by a third coil coupled to the drive transformer 902 (not shown). For example, the connection may be configured such that $I_{s1}$ flows when the primary current $I_{s1}$ in the primary side 904a of the drive transformer 902 flows in a first direction (e.g. is positive) and $I_{s1}$ does not flow when the primary current $I_1$ in the primary side 904a of the drive transformer 902 flows in a second direction (e.g. is negative), and such that $I_{s2}$ flows when the primary current $I_1$ in the primary side 904a of the drive transformer 902 flows in the second direction (e.g. is negative) and $I_{s2}$ does not flow when the primary current $I_{s1}$ in the primary side 904a of the drive transformer 902 flows in the first direction (e.g. is positive). As previously noted, it may be advantageous for the control mechanism to include a period of dead-time (with neither switch 906, 908 in the low-resistance state) around the zero crossing for the transformer current.

In one example of the technology, the control mechanism comprises one or more windings connected to the drive transformer 902 which provide the currents $I_{s1}$ and $I_{s2}$. As previously mentioned, it may be advantageous for the currents $I_{s1}$ and $I_{s2}$ to be activated in a synchronised manner with the current in the drive transformer 902. For example, when the drive current is positive, the current $I_{s1}$ may be activated, and the current $I_{s2}$ deactivated. Similarly, when the drive current is negative, the current $I_{s1}$ may be activated, and the current $I_{s2}$ activated (or vice-versa). This may be achieved using any regulation methods known to those skilled in the art, including semi-conductor switches such as diodes and transistors. For example, a diode may be provided to activate the varying magnetic field generators 912a, 912b in synchronicity with the respective phases of the drive current. In some examples, the forward voltage drop of the semi-conductor switch (such as a diode) may provide the circuit with a period of dead-time when neither switch is conducting.

In other examples of the technology described herein, it may be advantageous for the currents $I_{s1}$ and $I_{s2}$ to operate at a higher frequency than the drive current. In these examples, the control mechanism may be configured to activate the currents $I_{s1}$ and $I_{s2}$ based on the polarity of the drive current. For example, the drive current may be configured to enable the varying magnetic field generators 912a, 912b based on the polarity of the drive current. For example, a semi-conductor switch such as a transistor may be used to turn on the varying magnetic field generator 912a when the drive current is positive, and turn on the varying magnetic field generator 912b when the drive current is negative. Alternatively, a single varying magnetic field generator may be used, and the phase of the drive current may be used to switch the output of the varying magnetic field generator between the switches 906 and 908 using methods which should be apparent to those skilled in the art.

Figure 10:
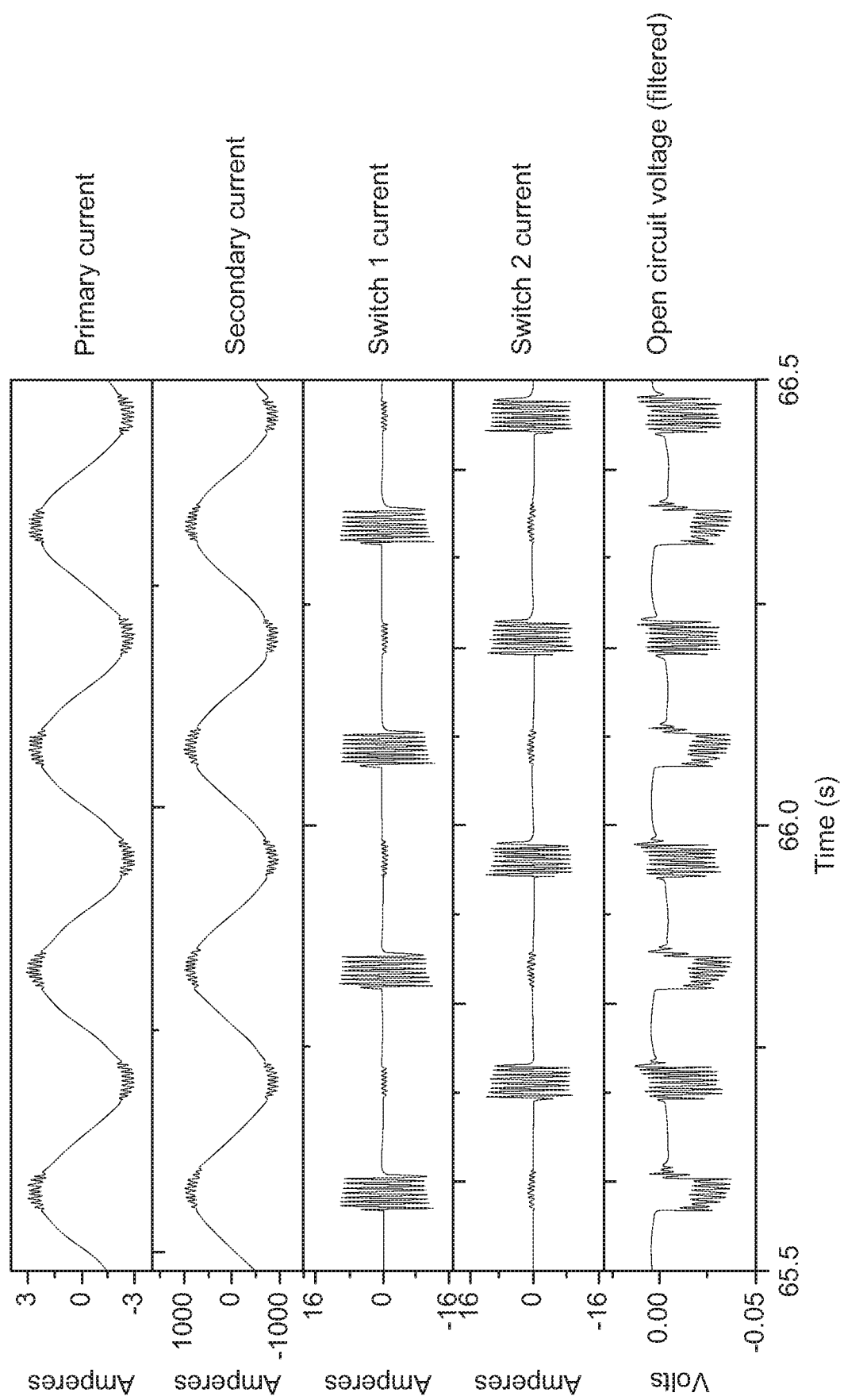
FIG. 10 shows exemplary current and voltage waveforms for a full-wave rectifier constructed in accordance with the embodiment of FIG. 9.

FIG. 10 shows the resulting current and voltage waveforms measured on a circuit constructed in accordance with the embodiment of FIG. 9. This figure includes 5 graphs which illustrate from top to bottom:

The current applied to the primary coil 904a of the drive transformer 902;

The current measured in the secondary (superconducting) coil 904b of the drive transformer 902;

The current applied to the generator coil 914a of the first varying magnetic field generator 912a;

The current applied to the generator coil 914b of the second varying magnetic field generator 912b; and The resulting open circuit voltage measured across the terminals 204, 206.

From these graphs it can be seen that the frequency of the current applied to the drive transformer 902 is lower than that of the frequency of the current generated in the generator coils 914a, 914b of the switches 906, 908. In practice the drive frequency was approximately 4 Hz and the screening current was approximately 200 Hz. By using a higher frequency in generator coils 914a, 914b it is possible to ensure that at least one cycle of the screening current is completed during the time that the switches 906, 908 are energised. It may be further advantageous for the switches to complete more than one cycle of screening current while the switch is energised (i.e. in its higher-resistance state) as shown in FIG. 10 as this may provide a more stable higher-resistance state.

The resulting open-circuit voltage waveform across terminals 204, 206 is shown to be full-wave rectified. In other words, irrespective of the polarity of the current of the drive transformer 902, the voltage across the terminals 204, 206 has negative voltage peaks that correspond to the high-resistance states of each of the switches 906, 908. As the voltage across the terminals 204, 206 during regulation has a consistent polarity (negative) the resulting current that would flow between the terminals 204, 206 into a load 706 would similarly be consistent and thereby full-wave rectified during the periods when one or more of the switches are in the higher-resistance state. In other words, the circuit of FIG. 9 is able to convert AC current to DC under superconducting conditions.

When both of the switches 906, 908 are inactive it can be seen that there is substantially zero output voltage across the terminals 204, 206 of the rectifier. One application for this rectified DC voltage would be the charging of superconducting magnets, However, this is not meant to be seen as limiting on the invention, and other applications should become apparent to those skilled in the art.

Figure 11:
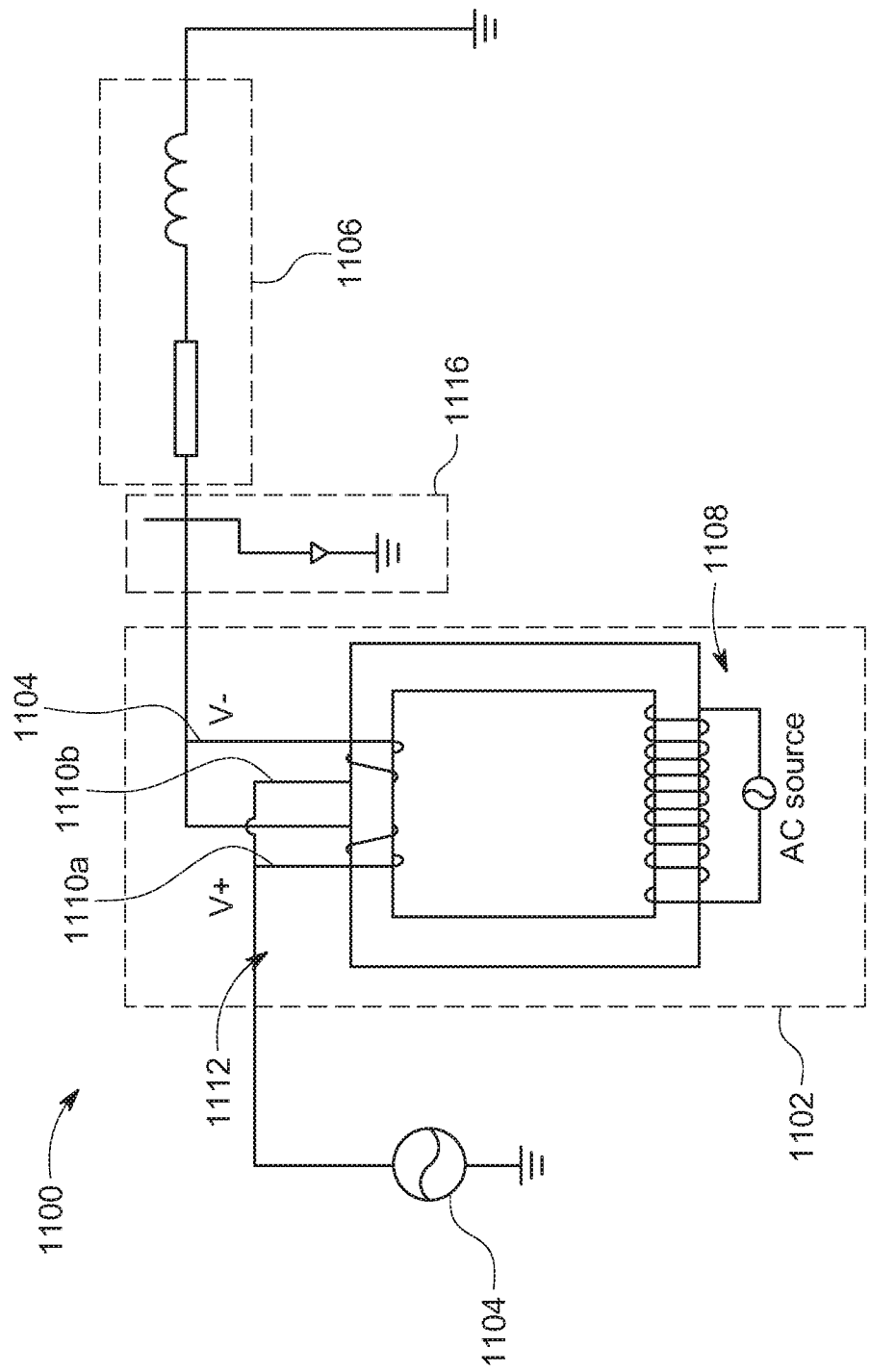
FIG. 11 shows a simplified schematic of a fault current limiter employing a switch according to the present technology.

FIG. 11 illustrates an active fault current limiter 1100 which employs a switch 1102 according to one form of the present technology.

In this embodiment an AC power source 1104 is connected in series with a switch 1102 and a load 1106. In use, the varying magnetic field generator 1108 of the switch 1102 is inactive or generating a varying magnetic field of a sufficiently small magnitude such that the current through each of the branches 1110a, 1110b of the loop 1112 does not exceed the critical current of the superconducting material 1114. This results in a low-resistance state in the switch 1102, and minimal voltage drop across the superconducting material 1114. When a fault 1116 such as an excessive load or short-circuit is applied to the circuit an increase in current may be detected using any methods known to those skilled in the art. Upon such detection a control mechanism may be configured to cause the varying magnetic field generator 1108 to be activated or increase its drive current in order to transition the switch 1102 into its higher-resistance state, thereby limiting the total power that will be delivered into the fault 1116.

Where the fault current limiter 1100 is employed in a domestic AC or grid power application (typically 50 to 60 Hz) it may be advantageous to drive the varying magnetic field generator 1108 at a frequency of several kilohertz or above for example 2 kHz to 100 kHz. This may ensure that multiple screening cycles are provided for each cycle of the source voltage, which may in turn provide a more stable limiting of the current in the circuit.

The fault current limiter 1100 of the present technology may have a number of advantages over existing fault current limiters including:

The ability to rapidly transition the switch 1102 to a higher-resistance state; for example the fault current limiter 1100 may be activated within milli-seconds of detecting a fault condition;

The ability to actively enable the fault current limiter 1100 based on any criteria; for example, it is possible to choose the current at which the fault current limiter 1100 is activated, decide when the fault current limiter 1100 is deactivated, or dynamically adjust the triggering fault current, for example based on the current load in the circuit; and Providing a safe, low rebound voltage into the AC power source 1104. In other words, as the switch 1102 can be constructed with a low or substantially zero-inductance configuration, it is possible to limit the current flow using a substantially resistive load, reducing the spikes that can occur due to the switching of inductive elements.

It should further be appreciated that the present technology may provide for greater resilience against damage due to hot-spots. Generally speaking, hot spots describe the phenomenon that the superconducting material is locally heated up by the transport current due to a local reduction in the critical current I of the superconducting wire. This local reduction in I may be caused by defects in the superconducting material, or by localised thermal or magnetic conditions which in turn cause localised heating and can result in a significant local temperature rise. These temperature rises can, in turn, damage the superconductor. This situation can be especially hazardous in fault current limiters.

As the present technology is able to generate a screening current which flows around the full loop of superconducting material, a substantial portion of, if not all, the superconductor is able to be driven into the higher-resistance state. As such the switch according to the present technology may be able to quench more homogenously along a longer length of superconducting wire than existing switches thus reducing the effects of localised heating.

Accordingly, applications for the present technology include superconducting magnets, magnetic resonance imaging (MRI), nuclear magnetic resonance (NMR), flux pumps, fault current limiters and magnetic energy storage systems.

Unless the context clearly requires otherwise, throughout the description and the claims, the words "comprise", "comprising", and the like, are to be construed in an inclusive sense as opposed to an exclusive or exhaustive sense, that is to say, in the sense of "including, but not limited to".

The entire disclosures of all applications, patents and publications cited above and below, if any, are herein incorporated by reference.

Reference to any prior art in this specification is not, and should not be taken as, an acknowledgement or any form of suggestion that that prior art forms part of the common general knowledge in the field of endeavour in any country in the world.

The technology may also be said broadly to consist in the parts, elements and features referred to or indicated in the specification of the application, individually or collectively, in any or all combinations of two or more of said parts, elements or features.

Where in the foregoing description reference has been made to integers or components having known equivalents thereof, those integers are herein incorporated as if individually set forth.

It should be noted that various changes and modifications to the presently preferred embodiments described herein will be apparent to those skilled in the art. Such changes and modifications may be made without departing from the spirit and scope of the technology and without diminishing its attendant advantages. It is therefore intended that such changes and modifications be included within the present technology.

The invention claimed is:

1. An electrical switch comprising:
   a loop of superconducting material,
      wherein the loop comprises a first branch and a second branch, the first and second branches being electrically connected in parallel between a first terminal and a second terminal, and wherein the loop has an axis which is substantially normal to the plane of the loop, and
      wherein the loop is configured to carry a transport current between the first terminal and the second terminal; and
   a magnetic field generator,
      wherein the magnetic field generator is configured to generate a time-varying magnetic field through the loop with the direction of the magnetic field through the loop being generally parallel to, or having a component which is generally parallel to, the axis of the loop,
   wherein the magnetic field generator is configured to be selectively activated and de-activated to switch the electrical switch between a low-resistance state and a higher-resistance state, and
   wherein, in the low-resistance state, the magnetic field generator does not generate the varying magnetic field through the loop and the transport current flows through the loop between the two terminals, and, in the higher-resistance state, the magnetic field generator generates the varying magnetic field through the loop, inducing a screening current in the loop, such that the sum of the transport current and the screening current in one or more of the first branch and second branch approaches the critical current, is substantially equal to the critical current or is greater than the critical current of the superconducting material.

2. The electrical switch of claim 1, wherein the superconducting material comprises a high-temperature superconductor.

3. The electrical switch of claim 1, wherein the superconducting material comprises rare-earth barium copper oxide (ReBCO).

4. The electrical switch of claim 1, wherein the superconducting material is comprised as part of a tape.

5. The electrical switch of claim 1, wherein the electrical switch further comprises joints, wherein the joints connect the first branch and/or second branch to the first terminal and/or second terminal.

6. The electrical switch of claim 5, wherein the joints comprise a non-superconducting material.

7. The electrical switch of claim 1, wherein the first branch comprises one or more coils of superconducting material and wherein the second branch comprises one or more coils of superconducting material.

8. The electrical switch of claim 7, wherein the coils of the first branch are wound around the same axis as the coils of the second branch.

9. The electrical switch of claim 7, wherein the coils of the first branch are wound in a first rotation direction and the coils of the second branch are wound in a second rotation direction, wherein the first rotation direction is different to the second rotation direction.

10. The electrical switch of claim 1, wherein the magnetic field generator comprises an alternating power source.

11. The electrical switch of claim 1, wherein, when the magnetic field generator is de-activated, it generates substantially no magnetic field, or a constant magnetic field.

12. The electrical switch of claim 1, wherein in the higher-resistance state the branches of the superconducting material are superconducting.

13. A rectifier comprising at least one electrical switch according to claim 1 and a control mechanism configured to control each of the at least one electrical switch between the low-resistance state and the higher-resistance state in order to rectify current from an alternating current source.

14. The rectifier according to claim 13, wherein the rectifier comprises a transformer comprising a primary side and a secondary side, wherein the at least one electrical switch is connected to the secondary side of the transformer.

15. The rectifier according to claim 14, wherein the control mechanism controls each of the at least one electrical switch between the low-resistance state and the higher-resistance state based on the direction of a flow of alternating current in the transformer.

16. The rectifier according to claim 13, wherein the rectifier is a half-wave rectifier.

17. The rectifier according to claim 13, wherein the rectifier is a full-wave rectifier.

18. The rectifier according to claim 13, wherein activation of the magnetic field generator induces a screening current in the branches which causes increased resistive dissipation in the superconducting material without quenching.

19. A fault current limiter comprising at least one electrical switch according to claim 1 and a control mechanism configured to put the at least one electrical switch in the higher-resistance state when a fault is detected.

20. The fault current limiter according to claim 19, wherein activation of the magnetic field generator induces a screening current in the branches which causes the superconducting material to quench.

\* \* \* \* \*